(12) United States Patent
Takaoka et al.

(10) Patent No.: US 6,597,180 B1
(45) Date of Patent: Jul. 22, 2003

(54) FAULT POINT LOCATION SYSTEM

(75) Inventors: Motokuni Takaoka, 82-1, 1-chome, Mikanyama-cho, Mizuho-ku, Nagoya (JP); Masanori Sugiura, Nagoya (JP)

(73) Assignees: Nippon Kouatsu Electric Co., Ltd., Nagoya (JP); Motokuni Takaoka, Nagoya (JP)

( * ) Notice: Subject to any disclaimer, the term of this patent is extended or adjusted under 35 U.S.C. 154(b) by 0 days.

(21) Appl. No.: 09/438,289

(22) Filed: Nov. 12, 1999

(30) Foreign Application Priority Data

Dec. 28, 1998 (JP) .......................... 10-373660
Mar. 5, 1999 (JP) .......................... 11-058877
Mar. 5, 1999 (JP) .......................... 11-058878

(51) Int. Cl.$^7$ .............................. G01R 31/08
(52) U.S. Cl. ...................... 324/512; 324/522
(58) Field of Search .................. 714/55, 100; 713/400; 370/503; 455/13.2, 67.1; 324/512, 520, 521, 535, 522

(56) References Cited

U.S. PATENT DOCUMENTS 5,070,537 A  * 12/1991 Ohira et al. ............... 455/67.3
5,508,619 A  *  4/1996 Ozawa et al. ............... 324/535
5,809,397 A  *  9/1998 Harthcock et al. .......... 455/13.2
6,259,255 B1 *  7/2001 Ohira et al. ............... 324/535

FOREIGN PATENT DOCUMENTS

EP   0 362 406 A1   4/1990   ........... G01R/31/08
EP   0 427 077 A1   5/1991   ........... G04G/3/02
EP   0 649 029 A2   4/1995   ........... G01R/31/08
JP   56-63274      5/1981   ........... G01R/31/08
JP   58-28219      6/1983   ........... G01R/31/08
JP   63-51274      10/1988  ........... G01R/31/08
JP   8-15362       1/1996   ........... G01R/31/08

OTHER PUBLICATIONS

Paul Ross, "Improving GPS Accuracy by Averaging," http://dragon.swansea.linux.org.uk/~paulr/statictest/meantext.html, Sep. 5, 1996.*
Carbonelli, M., et al.: "Synchronization of SDH Networks: Slave Clocks Model and Stability Measures", Proceedings of the Global Telecommunications Conference (GLOBECOM), U.S., New York, IEEE, vol.—. Dec. 6, 1992 pp. 829–833, XP000357680, ISBN: 0–7803–0608–2, p. 830, col. 2—p. 832, col. 2.

* cited by examiner

Primary Examiner—N. Le
Assistant Examiner—John Teresinski
(74) Attorney, Agent, or Firm—Morgan, Lewis & Bockius LLP

(57) ABSTRACT

A fault point location system comprises substation 1 installed along transmission and distribution line (TD line) to send a surge detection time (SD time), and master station 2 locates fault points based on the information. Substation 1 stores and updates past voltage or current waveforms of the TD line, stores a surge recognition level L2 (higher than a noise level), and a surge waveform starting level L1 (set lower than level L2), determines as the SD time, in the case where the voltage or current of the TD line exceeds level L2, the time at which the voltage or current first exceeded level L1 after going back through the waveforms stored from the time at which the surge recognition level was exceeded, and sends the SD time to master station 2 via the communication network.

7 Claims, 11 Drawing Sheets

◎Equation for locating the distance to the fault point
L 1 = (L + (t 1 − t 2) × v) / 2
v : propagation velocity
    1 5 0 ~ 3 0 0 m/μ s

FAULT POINT LOCATION SYSTEM

BACKGROUND OF THE INVENTION

The present invention relates to a fault point location system. More particularly, the present invention relates to a fault point location system by which reference time is accurately determined. Furthermore, another present invention relates to a fault point location system by which accurate surge detection time is provided without increasing the frequency of erroneous detection. Still furthermore, another present invention relates to a fault point location system by which fault points can be accurately located.

Heretofore, when a fault occurs along the way of a power transmission line and distribution line (hereinafter designated "transmission and distribution line" or "TD line" for both lines), a method is known by which the fault point on the TD line is determined in accordance with a difference in surge detection time at two substations situated across the fault point (Japanese Patent Publication No. Sho 63 (1988)-51274, etc.). In the foregoing method, the accuracy of locating a fault point depends on the accuracy of determining the time at which a surge is detected (hereinafter designated the "surge detection time" or "SD time") at the substations on both ends of the fault point.

The SD time is often determined by means of a reference clock provided in each substation in combination with GPS radio waves.

Many of these reference clocks employ the temperature compensated crystal oscillator or a crystal oscillator with a thermostat which presents a good clocking capability scarcely affected by variation in temperature. However, clock errors may be accumulated over a long period of time and thus become not negligible in surge detection (refer to FIG. 9).

Accordingly, GPS radio waves are used for synchronizing the reference time between each substation. The GPS radio waves are transmitted by satellites of the GPS (Global Positioning System). The GPS is a system in which radio waves are received from a plurality of satellites for positioning on the basis of a difference in time for receiving the waves. For this purpose, the synchronization signal for which time is controlled with high accuracy is transmitted. This synchronization signal has an extremely small accumulation of errors over a long term depending on local areas.

However, as shown in FIG. 8, each synchronization signal lags or advances to a certain extent. For this reason, simple adjustment of the reference time with the synchronization signal may contrarily provide inaccurate time and result in an inadequate SD time.

Additionally, radio disturbance disabling the GPS radio waves to be received may result in a situation where time cannot be detected and thus fault points cannot be located.

On the other hand, in the detection of a surge, it is regarded to "have detected a surge" when a surge voltage or surge current exceeds a threshold value. The time at which a surge waveform rises can be more accurately captured (initially) with lower voltage or current threshold value, however, erroneous detection of a surge may frequently occur with exceedingly low threshold value due to current or voltage with noises occurring under normal conditions on a TD line. For this reason, the threshold value for recognizing the occurrence of a surge is set to a level higher to some extent so as not to detect a noise incorrectly. Therefore, "surge detection" is carried out after the expiration of a certain time in the rise of the surge waveform.

In addition, the surge received by the two substations across a fault point may take different waveforms due to propagation loss on the TD line. In such a case, as shown in FIG. 12, one of the substations with a more deformed surge waveform may have a longer rising time in the surge, thus delaying in "surge detection". This disables accurate location of a fault point in accordance with a difference in SD time at substations across the fault point.

There is a method called the double potential method for compensating the lapse of time resulting from a threshold value set to a high level and obtaining more accurate "SD time". As shown in FIG. 13, this method determines "SD time T" in a manner such that, on the graph with time on horizontal axis and voltage on the vertical axis, the two points (each of which exceeds reference level L1 and L2 that were set to a certain value respectively) on the graph of a surge waveform are connected with a straight line to make the intersection (time) of the line with the voltage of zero level, that is, the horizontal axis a "SD time T".

That is, in the double potential method, when the voltage or current of a TD line exceeds a certain reference level and then increases further to exceed another reference level, an approximate line of the voltage curve is drawn by connecting the points of intersection of the two levels with the voltage curve, and the point of intersection of the approximate line with the voltage zero level is determined to be SD time T.

Various modified inventions and utility models have been applied for patent with this double potential method (Japanese Utility Model Publication No. Sho 58 (1983)-28219, Japanese Laid-Open Patent Publication No. Hei 8 (1996)-015362, etc.).

As mentioned above, however, the voltage and current of a TD line have noise. When a comparatively large noise occurs or a noise is imposed on a surge waveform, the voltage or current exceeds aforementioned first reference level L1 on the TD line and then may decline. In such a case, as shown in FIG. 14, connecting "the point of intersection of another reference level L2 with the voltage curve" to "the point of intersection of the first reference level L1 with the voltage curve" with a straight line results in an inaccurate approximate line of the voltage curve and contrarily causes calculated SD time T to depart from the practically desirable time Tr.

SUMMARY OF THE INVENTION

The present invention solves these problems; the objects of the present invention are to provide a fault point location system by which accurate SD time is obtained to locate fault points, a fault point location system by which accurate SD time can be obtained without increasing the frequency of erroneous detection, and a fault point location system by which fault points can be accurately located.

A fault point location system of a first invention comprises substations (1) which are installed along a TD line to transmit information on the SD time to a master station (2), and the master station (2) which locates fault points on the basis of the information on said SD time; wherein said substation (1) determines the difference between the standard time of the GPS has which is obtained from the GPS radio wave received, and the reference time of said substation (1) has at which said standard time has been obtained, accumulates said difference over a certain period of time, corrects the reference time by adding the average value of said difference stored to said reference time, determines the detection time of a surge voltage or surge current produced by a fault having occurred at a certain point on the TD line in accordance with said reference time, and then transmits the detection time to said master station (2) via a communication network.

And, said master station (2) determines, as shown in the fault location system of a second invention, in accordance with said SD time t1 detected at one of a pair of substations across a fault point on said TD line network, said SD time t2 detected at the other substation, surge propagation velocity v, and length L of the TD line between said substations, distance L1 on the TD line from one of the substations to said fault point by equation $L1=(L+(t1-t2)\times v)/2$.

Furthermore, said master station (2) determines, as shown in the fault point location system of a third invention, in accordance with said SD time t1 detected by a substation nearest to the source-side end along said TD line network, said SD time t2 detected by another substation at the distal end of the TD line network, surge propagation velocity v, and length L of the TD line between said substations, distance L1 on the TD line from the substation at said source-side end to said fault point by equation $L1=(L+(t1-t2)\times v)/2$; and furthermore, determines, in accordance with said SD time t3 detected at one of a pair of substations across the fault point determined by the aforementioned calculation, said SD time t4 detected at the other substation, surge propagation velocity v, and length L' of the TD line between said pair of substations, distance L3 on the TD line from said one of the substations to said fault point by equation $L3=(L'+(t3-t4)\times v)/2$.

The present fault point location-system is a system which employs the method for correcting the reference time to be used as the detection time of the surge voltage or surge current produced by a fault having occurred at a certain point on the TD line and which performs location by determining the difference between the standard time of the GPS which is obtained from the GPS radio wave received, and the reference time at which said standard time has been obtained, accumulating said difference over a certain period of time, and correcting the reference time by adding the average value of said difference stored to said reference time.

The individual synchronization signal of the standard time outputted by the GPS receiving means (hereinafter designated the "synchronization signal") is not accurate and outputted with a certain range of error against the global standard time, the absolute reference. For example, in the case where a GPS receiver outputs the synchronization signal at each second the standard time increments, and collects errors of the synchronization signal against the standard time over a certain period of time (such as for one day) to plot the data on a graph, a normal distribution graph is obtained as shown in FIG. 8, from which it can be seen that errors occur in a certain range.

What should be noted in the foregoing is not that the errors of the synchronization signal vary in a certain range, but that the result of calculation of the errors has a normal distribution with the position where errors against the standard time become zero as the center of the distribution. That is, this means that the average value of the calculated data is the center of the normal distribution graph and thus the error against the standard time becomes zero.

It can be seen that the synchronization signal of the GPS receiver has an error against the standard time in a range of approximately 200 ns in a short period of time such as the unit of a second, however, has a property where the average value over a period of time of one day or one week has an error which approaches infinitesimally to zero.

Now, for the reference time signal to be outputted by the oscillator, the oscillator normally employs the temperature compensated crystal oscillator or the crystal oscillator with a thermostat to obtain the reference time signal with high accuracy and stability.

These oscillators are extremely stable against variation in ambient temperature and readily provide accuracy which is hardly affected by variation such as of a lag or an advance in the reference time signal for a short period of time (such as for one second, one minute, one day, or one week). On the other hand, they have such a property that, over a long period of time such as for one year or 10 years), an infinitesimal error in time of the reference time signal is accumulated to produce a large accumulated error in the reference time.

In FIG. 9, as a typical example, shown is a graph of the characteristic of a variation in time of the reference time signal frequency which is outputted by the crystal oscillator with a thermostat. As shown in FIG. 9, an error is hardly found in a short period of time, however, infinitesimal errors in time accumulate over a long period of time to result in a not negligible error.

This leads to determining the time generated by the reference time signal of the oscillator to be the reference time and then correcting the reference time by the average value of the error obtained between the reference time at which the synchronization signal accumulated over a certain period of time is received and the standard time. That is, adding the difference in time between the reference time signal and the reference time at which the synchronization signal is received allows for keeping the accuracy of time (refer to FIG. 6). Furthermore, as shown in FIG. 7, periodic implementation of this correction allows for confining the error to a narrower range compared with the case of no correction.

As mentioned in the foregoing, periodic implementation of correction of the reference time with an average value obtained from the reference time at which the synchronization signal accumulated over a certain period of time is received and the standard time allows for always obtaining an accurate standard time. Furthermore, detecting a surge by each substation with the accurate standard time and thus transmitting an accurate SD time to the master station allows for determining the fault point of the TD line.

A fault point location system of a fourth invention comprises substation 1 which is installed on a TD line to transmit information on the SD time to a master station 2, and the master station 2 which locates fault points on the basis of the information on said SD time, characterized in that;

said substation 1 stores and updates the past voltage or current waveforms of said TD line ranging at least from the current time to the time preceding for a certain period of time, stores the surge recognition level which is a reference level for recognizing surges and sets to a level higher than the noise level, and the surge waveform starting level which is a reference level for determining the starting point of surge waveforms and sets to a level lower than said surge recognition level, determines as the SD time, in the case where the voltage or current of said TD line exceeds said surge recognition level, the time at which said voltage or current exceeded said surge waveform starting level for the first time after going back through said waveforms stored from the time at which said surge recognition level was exceeded, and sends said SD time to said master station 2 via the communication network.

In the foregoing, "the time at which said voltage or current exceeded said surge waveform starting level for the first time after going back through said waveforms stored from the time at which said surge recognition level was exceeded" means the time at which, speaking in terms of the direction of time axis, the voltage or current exceeded the last time of the surge waveform starting level, that is, at the time nearest to the time the surge recognition level was exceeded.

Furthermore, "the SD time" is the time at which a substation receives and detects a surge voltage or surge current produced by a fault occurred at a certain position on said TD line.

Furthermore, said "past voltage or current waveforms" are stored in a form of discrete values to be sampled at intervals of constant time. This allows for determining said "SD time" to be the sampling time next to the sampling time at which, going back from the time at which said surge recognition level was exceeded, a sample value fell short of said surge waveform starting level for the first time.

In the foregoing, the "next" means the "first of the following along the direction of time axis". That is, the time at which a sample value below the surge waveform starting level has just exceeded the surge waveform starting level is determined as the "SD time".

Furthermore, for example, such method for determining the SD time is conceivable in that the "sampling time at which a sample value falls short of said surge waveform starting level for the first time is determined to be the "SD time". There is no inconvenience in such method in the case where the interval of sampling is sufficiently small compared with required accuracy of time.

The fault point location system may be an embodiment below.

That is, a fault point location system comprising;

substation 1 which is installed on a TD line to transmit information on the SD time to a master station 2, and the master station 2 which locates fault points on the basis of the information on said SD time; wherein said substation 1 comprises a surge detecting means 13 and a surge information transmitting means 14b, and said surge detecting means 13 comprises a surge waveform storing means 136 and a surge recognition means.

Said surge waveform storing means 136 stores and updates the past voltage or current waveforms of said TD line ranging at least from the current time to the time preceding for a certain period of time, and transmits the information on said past voltage or current waveforms to said surge recognition means in response to the requirement of said surge recognition means.

Said surge recognition means stores the surge recognition level which is a reference level for recognizing surges and sets to a level higher than the noise level, and the surge waveform starting level which is a reference level for determining the starting point of surge waveforms and sets to a level lower than said surge recognition level, receives the information on the past voltage or current waveforms from the surge waveform storing means 136 in the case where the voltage or current of said TD line exceeds said surge recognition level, determines as the SD time, the time at which said voltage or current exceeded said surge waveform starting level for the first time after going back through said waveforms stored from the time at which said surge recognition level was exceeded, and transmits said SD time to said surge information transmitting means 14b.

Furthermore, said surge information transmitting means 14b transmits said SD time to said master station 2 via a communication network.

A fault point location system of a fifth invention is a fault point location system according to claim 4 wherein said master station 2 determines, in accordance with said SD time t1 detected at one of a pair of substations across a fault point on said TD line network, said SD time t2 detected at the other substation, surge propagation velocity v, and length L of the TD line between said substations, distance L1 on the TD line from one of the substations to said fault point by equation $L1=(L+(t1-t2)\times v)/2$.

A fault point location system of a sixth invention is a fault point location system according to claim 4 wherein said master station 2 determines, in accordance with said SD time t1 detected by a substation nearest to the source-side end on said TD line network, said SD time t2 detected by another substation at the distal end of the TD line, surge propagation velocity v, and length L of the TD line between said substations, distance L1 on the TD line from the substation at said source-side end to said fault point by equation $L1=(L+(t1-t2)\times v)/2$; and furthermore, determines, in accordance with said SD time t3 detected at one of a pair of substations across the fault point determined by the aforementioned calculation, said SD time t4 detected at the other substation, surge propagation velocity v, and length L' of the TD line between said pair of substations, distance L3 on the TD line from said one of the substations to said fault point by equation $L3=(L'+(t3-t4)\times v)/2$.

A fault point location system of a seventh invention is a fault point location system according to claim 4 wherein said past voltage or current waveforms are stored in a form of discrete values to be sampled at intervals of constant time, allowing for determining, as said SD time, the sampling time next to the sampling time at which, going back from the time at which said surge recognition level was exceeded, a sample value fell short of said surge waveform starting level for the first time.

EFFECTS OF THE INVENTION

The fault point location system of the first invention, each substations determining the time generated by the reference time signal of the oscillator to be the reference time and then correcting the reference time by the average value of the error obtained between the reference time at which the synchronization signal accumulated over a certain period of time is received and the standard time. This correction allows substations to determine the SD time accurately and thus allows the master station to locate a fault point accurately.

The fault point location system of the fourth invention allows for recognizing a surge depending on whether or not the voltage or current on the TD line exceeded the surge recognition level which is set to a level higher than the noise level and allows for determination of the starting point of surge waveform, that is, the SD time at the surge waveform starting level which is set to a level below the surge recognition level. That is, different reference levels are provided for surge recognition and for recognizing the starting point of surge waveform respectively.

Accordingly, the surge waveform starting level can be set to a low level so as to make delay in time of surge detection sufficiently small. Therefore, preventing erroneous detection due to noise and decreasing delay in time of surge detection can go hand in hand.

Furthermore, the surge waveform starting level can be set to a low level and thus, even in the case where deformed surge waveforms are received at each substation due to propagation loss over a TD line, the SD time at each substation can be determined accurately to the same extent. That is, this leads to small amount of variation in SD time caused by the difference in the rising time of a surge received by each substation.

Additionally, going back through the stored surge waveforms from the latest one after the current or voltage has exceeded the surge recognition level allows for determining the SD time accurately even when a preceding surge exists as shown in FIG. 14.

The fault point location system of the second and fifth invention allows for readily estimating the position of a fault on the TD line network in accordance with the SD times of two substations.

The fault point location system of the third and sixth invention first allows for calculating an approximate position of a fault point between the source-side end and the distal end, and then allows for re-calculating the position of the fault point between a pair of substations across the position of the fault point determined by the foregoing calculation.

Therefore, re-calculating the position of a fault point between substations apart from each other within a short distance allows for decreasing the effects of error due to loss such as propagation loss over the TD line when locating a fault point. That is, the position of the fault points is allowed to locate accurately.

The fault point location system of the seventh invention allows the past waveforms to be stored in a form of discrete values and thus allows storage units to have only a small capacity of memory required, and allows for determining the SD time and locating fault points accurately.

Furthermore, the system allows for determining the SD time at substations accurately, also allowing for locating fault positions readily and accurately on the TD line network in accordance with the SD time.

That is, the system allows for decreasing lag in SD time from the actual start-point of surge reception and thus allows for decreasing error in locating fault points due to the difference in the rising time of a surge signal at each substation.

The fault point location system of above inventions comprises a master station and thus the master station allows for determining a fault point in accordance with the information on the SD time from each substation. Furthermore, the system is provided with the master station separately from substations installed on the TD line network, thereby leaving the function for determining a fault point to the facilities of the master station to make the facilities of each substation simple and compact.

PREFERRED EMBODIMENTS OF THE INVENTION

The embodiments of the present invention will be explained below with reference to the attached drawings.

Embodiment 1

(1) The Configuration of the a Fault Point Location System

Figure 1:
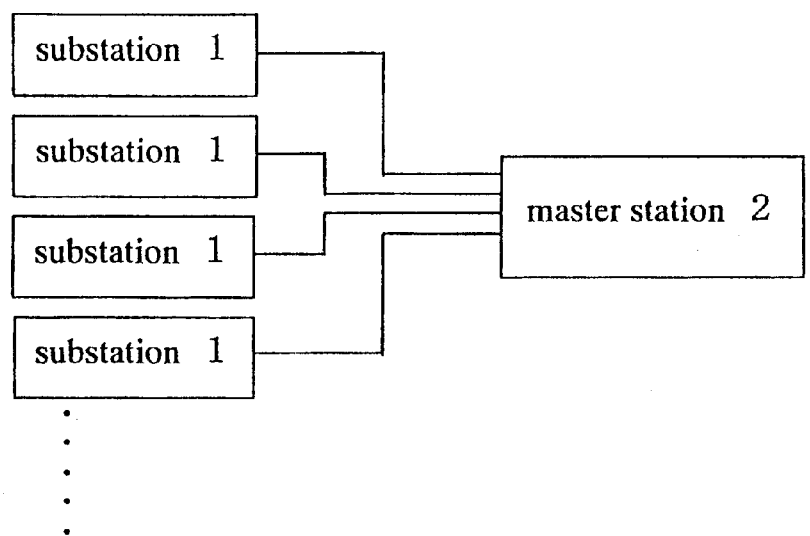
FIG. 1 is an explanatory view showing the relationship between a master station and substations described in Embodiment 1 and FIG. 2 is an explanatory view showing each component of substations described in Embodiment 1.

As shown in FIG. 1, the fault point location system of a first embodiment of the present invention comprises;

substations 1 which are installed at each steel tower or pole along TD lines and a master station 2 which are installed at a service office or branch office of a power company, locate fault points on the basis of information from substations 1.

(a) Substations

Figure 2:
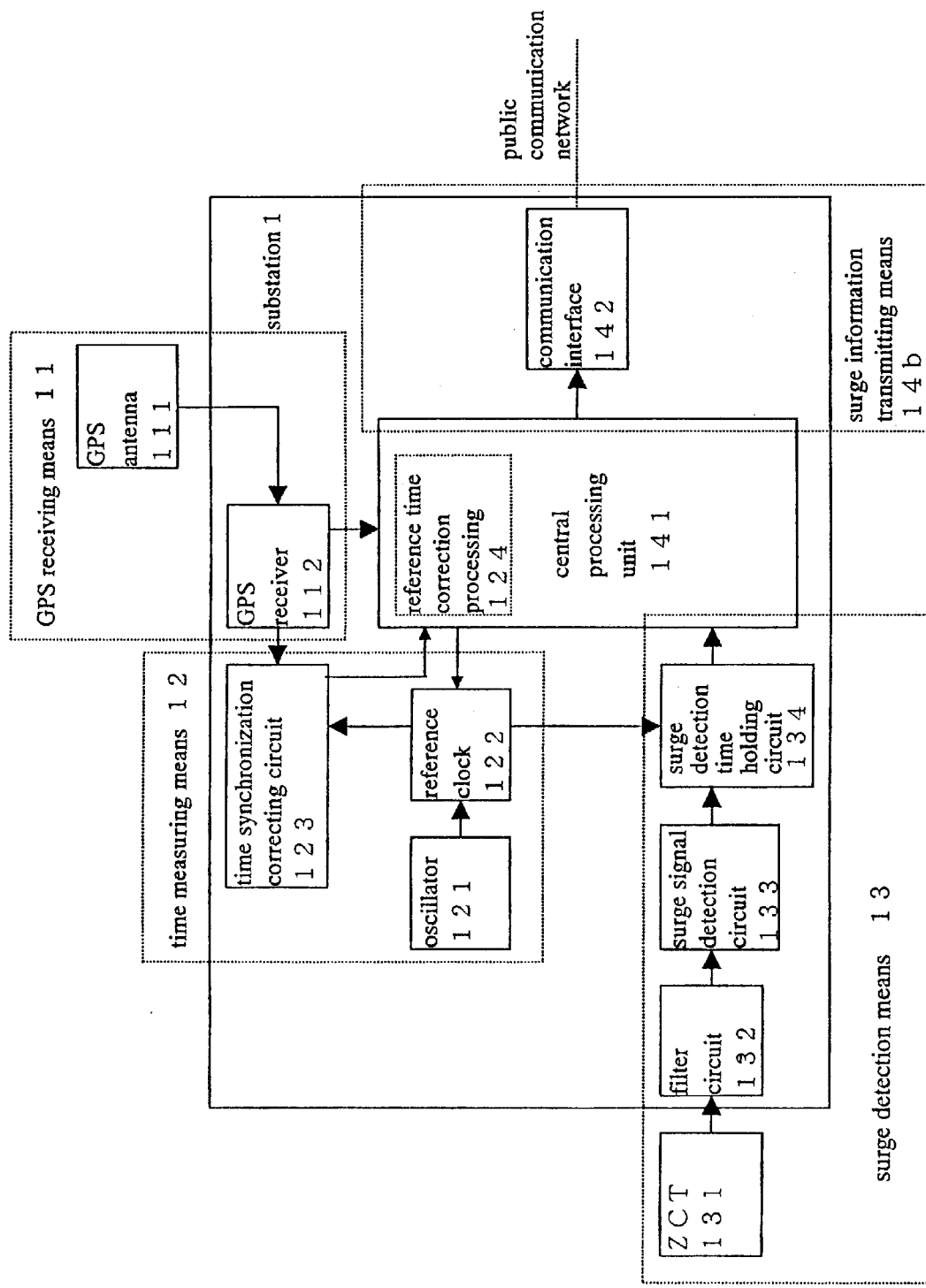

As shown in FIG. 2, a substation 1 is provided with a GPS antenna 11, a GPS receiver 112, an oscillator 121, a reference clock 122, a reference time holding circuit 123, a ZCT 131 (zero-phase current transformer), a filter circuit 132, a surge signal detection circuit 133, a SD time holding circuit 134, a central processing unit 141, and a communication interface 142.

The ZCT 131 (zero-phase current transformer), the filter circuit 132, the surge signal detection circuit 133, the SD time holding circuit 134, and part of the central processing unit 141 correspond to the ×surge detecting means 13" designated in the claims and the summary of the invention. Similarly, the central processing unit 141 and the communication interface 142 correspond to the "surge information transmitting means 14b". Likewise, the GPS antenna 111 amid the GPS receiver 112 correspond to the "GPS receiving means 11". Furthermore, the oscillator 121, the reference clock 122, and the reference time holding circuit 123 correspond similarly to the "clocking means 12".

Each component of a substation will be explained below.
i) ZCT 131 (Zero-phase Current Transformer)

The ZCT 131 is mounted on a steel tower of a TD line to detect surge signals (surge current) that occur at the time of a fault and then send the surge signals to the filter circuit 132. To detect surge voltage as surge signals, a voltage detector such as a PT or PD is used.
ii) Filter Circuit 132

The filter circuit 132 filters signals, which the ZCT 131 has detected, removes unnecessary commercial frequency components etc., except for a surge signal and allows to pass only the surge signal, and then send the surge signal detection circuit 133.

iii) Surge Signal Detection Circuit 133

The surge signal detection circuit 133 detects the level of a surge signal, then determines that a fault has occurred on the basis of the surge signal if the signal level exceeds a surge recognition value, and then outputs a time holding signal to the SD time holding circuit 134.

iv) Surge Detection Time Holding Circuit 134

When a time holding signal is outputted from the surge signal detection circuit 133, the SD time holding circuit 134 holds the time of the reference clock 122 at the time of the output to output the time as the SD time to the central processing unit 141.

v) GPS Antenna 111 and GPS Receiver 112

The GPS antenna 111 receives radio waves from GPS satellites to send the radio waves to the GPS receiver 112. Then, the GPS receiver 112 extracts, as a synchronization signal, the information on the standard time of the GPS satellite from the radio waves and then sends the signal to the reference time holding circuit 123.

vi) Reference Time Holding Circuit 123

Receiving the synchronization signal from the GPS receiver 112 causes the reference time holding circuit 123 to hold the reference time of the reference clock 122 at the time of reception of the signal, and then outputs the reference time to the central processing unit 141.

vii) Reference Clock 122

The reference clock 122 outputs the reference time to the reference time holding circuit 123 and the SD time holding circuit 134.

viii) Oscillator 121

The oscillator 121 outputs the reference time signal for measuring time to the reference clock 122.

ix) Central Processing Unit 141

The central processing unit 141 sends the SD time that is outputted by the SD time holding circuit 134 to the master station 2 via the communication interface 142. In addition, the central processing unit 141 collects the reference time received from the reference time holding circuit 123 for one day as time deviation data resulting from a comparison with the standard time, then determines the average deviation value from the standard time on the basis of the deviation data, adds the value as a correcting value to the reference clock 122, and then performs reference time correction processing 124 wherein reference time is corrected.

x) Communication Interface 142

The communication interface 142 passes communication signals between the central processing unit 141 and the public communication network so that the central processing unit 141 can communicate with a master station 2 via the public communication network.

b) Master station

Figure 3:
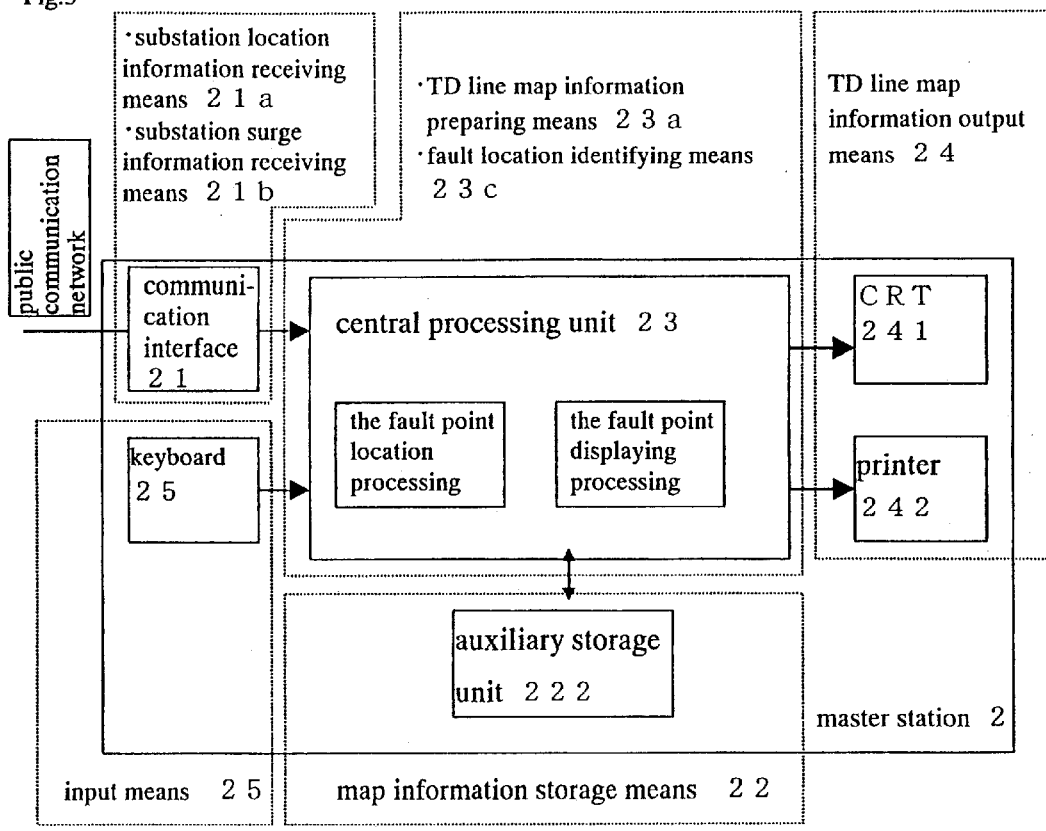
FIG. 3 is an explanatory view showing each component of a master station described in Embodiment 1 and 2.

As shown in FIG. 3, the master station 2 comprises a communication interface 21, an auxiliary storage unit 222, a central processing unit 23, a CRT 241, a printer 242, and a keyboard 25.

In the foregoing, the communication interface 21 receives information on SD time from each substation and corresponds to the "substation surge information receiving means 21b" designated in the summary and claims of the present invention. The central processing unit 23 locates a fault position according to SD time and corresponds similarly to the "fault position identifying means 23c". Furthermore, the CRT 241 and the printer 242 outputs the results of the location and correspond similarly to the "information output means 24". Likewise, the keyboard 25 corresponds to the "input means".

Each component of the master station will be explained below.

i) Communication Interface 21

The communication interface 21 passes communication signals between the master station and substations 1. That is, the communication interface 21 converts signals transmitted from a substation 1 via the public communication network to supply the converted signal to the central processing unit 23.

ii) Central Processing Unit 23 (Such as Personal Computers and Workstations)

The central processing unit 23 receives the position information and SD time, transmitted by each substation 1, 1, 1 . . . via the communication interface 21, and performs the fault point location processing which will be described later. Fault points obtained through the fault point location processing are outputted to the CRT 241 or the printer 242 together with TD line map data stored in the auxiliary storage unit 222.

iii) Auxiliary Storage Unit 222 (Such as Hard Disks)

The auxiliary storage unit 222 records and stores therein the position information and SD time which are transmitted by each substation 1, 1, 1 . . . , fault points calculated by the central processing unit 23, and TD line map data which is necessary for processing at the central processing unit 23.

In the foregoing, the TD line map data includes position data of poles and steel towers, and distance data between poles (steel towers).

iv) Printer 242

Following the command by the central processing unit 23, the printer 242 prints out the TD line map data or the results of fault point location, which are sent by the central processing unit 23.

v) CRT 241

Following the command of the central processing unit 23, the CRT 241 displays the TD line map data or the results of fault point location, which are sent by the central processing unit 23.

vi) Keyboard 25 (Input Means)

The keyboard 25 allows drawing data etc., necessary for preparing TD line maps to be entered. Here, the drawing data includes position data of poles and steel towers, and distance data between poles (steel towers).

(2) Reference Time Correction Processing

Figure 5:
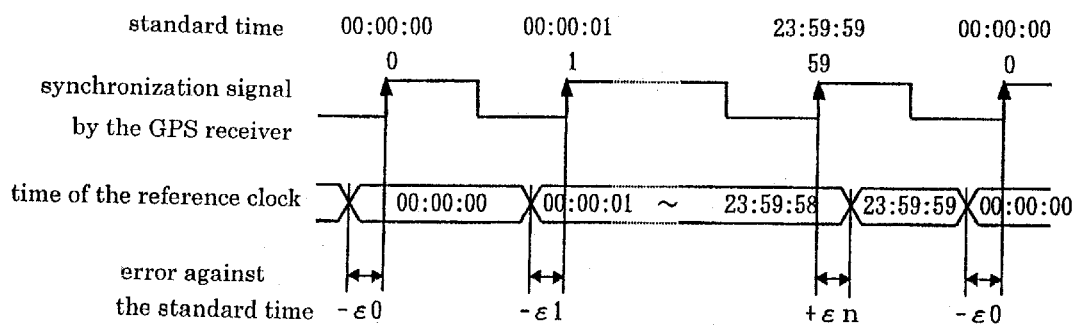
FIG. 5 is an explanatory view showing the process for correcting the reference time described in Embodiment 1.

The method for reference time correction processing will now be explained which is performed in the reference time correction processing 124.

i) At the step where the power source of a substation is turned on and the GPS receiver 112 starts to output synchronization signals and standard time data, the central processing unit 141 receives standard time data from the GPS receiver 112, sets the time data to the reference clock 122 as the reference time, and then times the clock time of the reference clock 122 with the standard time.

ii) In the case where the GPS receiver 112 outputs the synchronization signal outputs, for example, at each one second, the time of the reference clock 112 is held in the reference time holding circuit 123, and thus the central processing unit 141 accepts the time to the synchronization signal outputted at each one second. Simultaneously, standard time data is outputted by the GPS receiver 112 and thus the standard time data is also accepted to determine the deviation between the standard time and reference time $(-\epsilon 0, -\epsilon 1, \ldots, +\epsilon n)$ and then to be stored as the time deviation data (Refer to FIG. 5).

Figure 6:
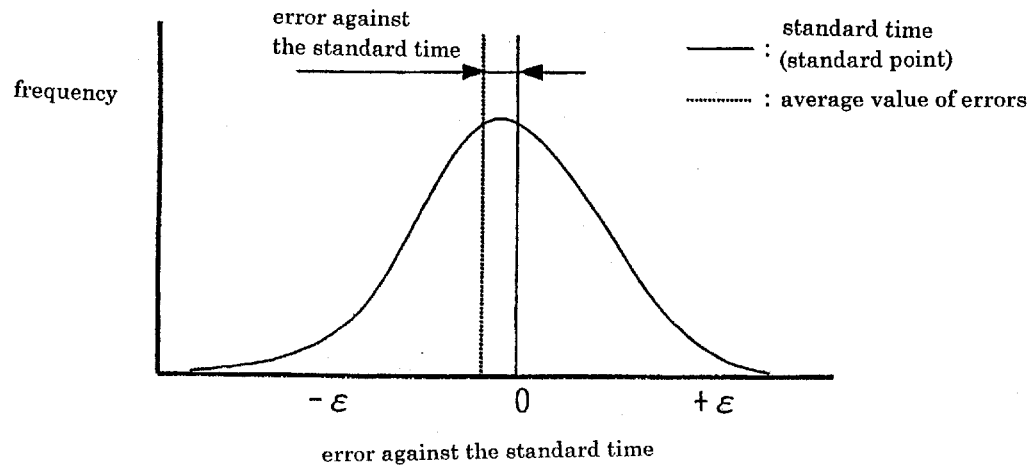
FIG. 6 is an explanatory view showing the process for correcting the reference time described in Embodiment 1.
Figure 7:
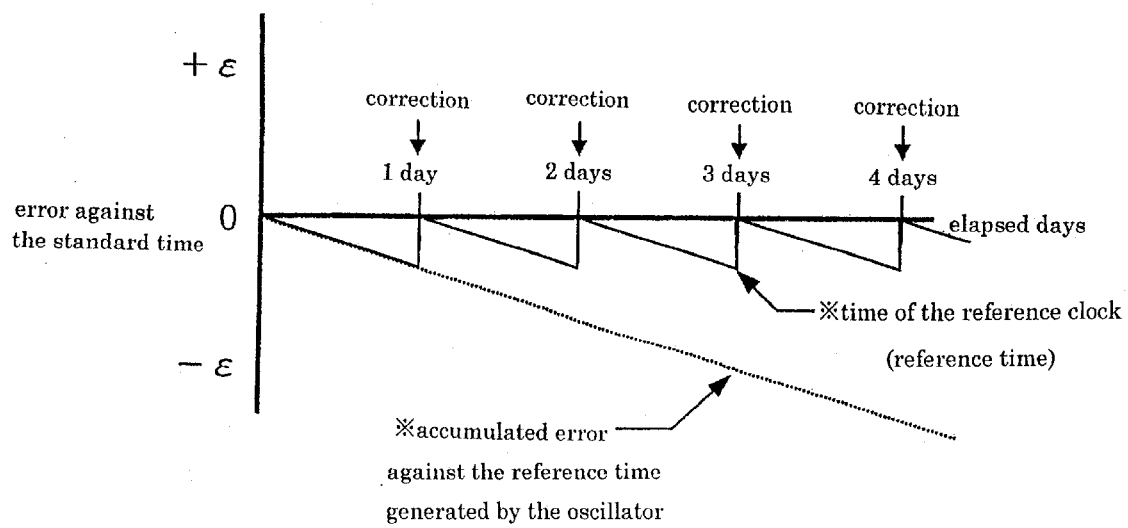
FIG. 7 is an explanatory view showing the process for correcting the reference time.
Figure 8:
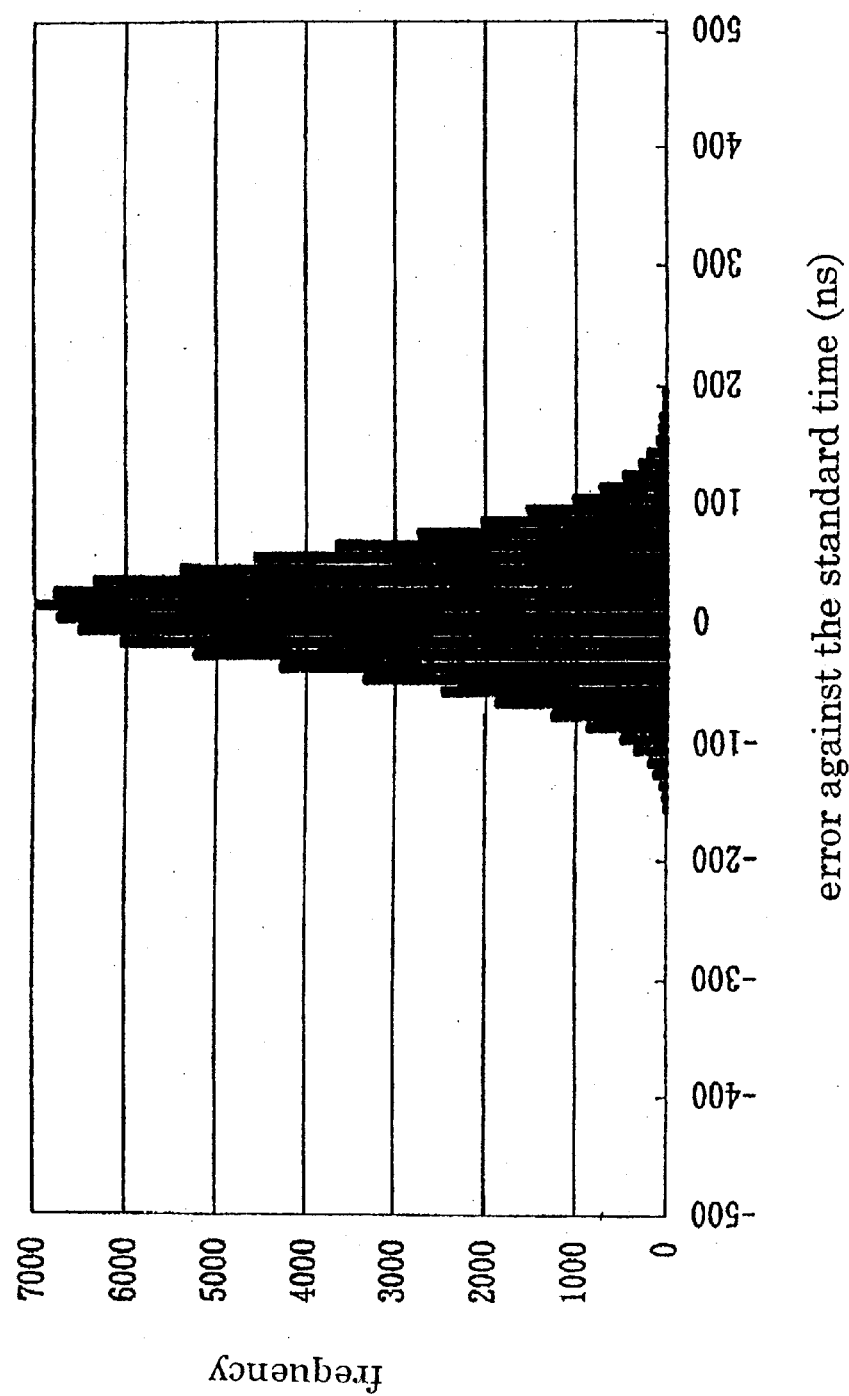
FIG. 8 is an explanatory graph showing the distribution of the synchronization signal errors against the standard time.
Figure 9:
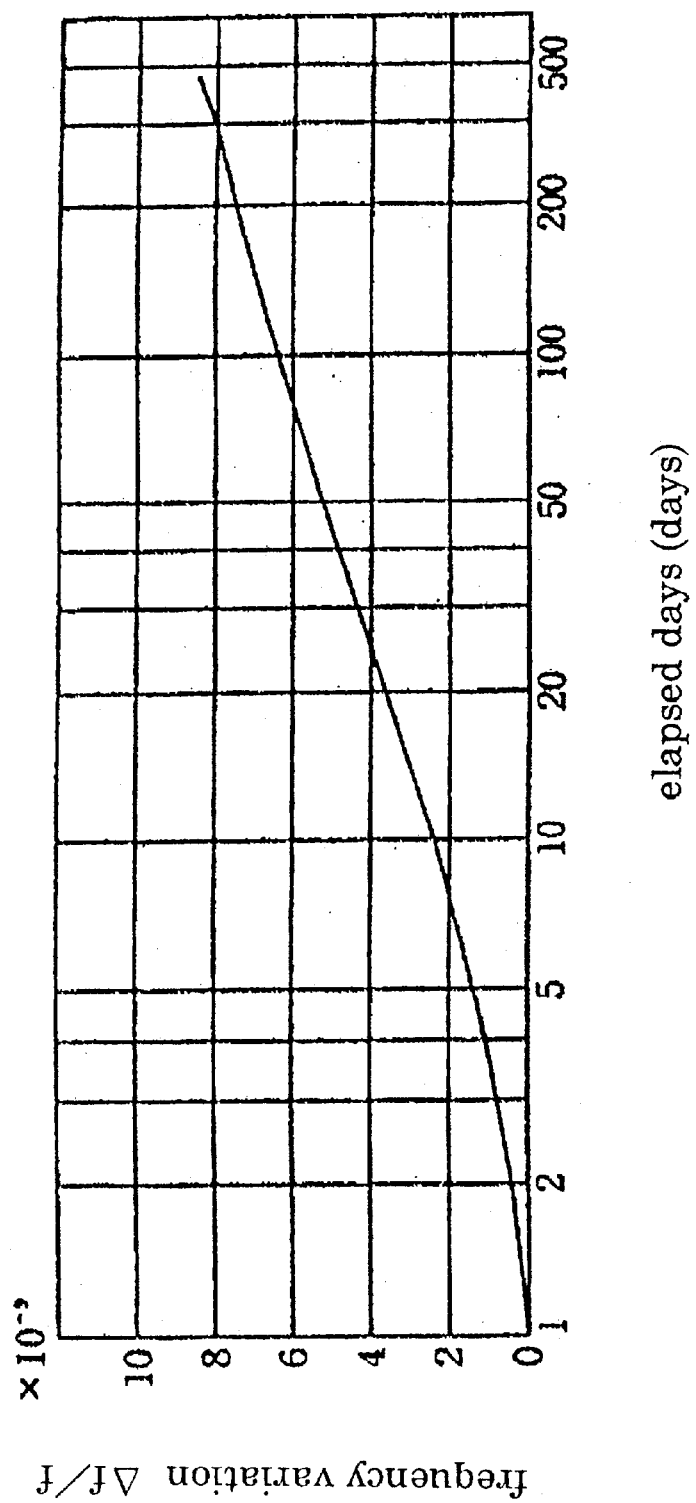
FIG. 9 is an explanatory graph showing the accumulated error of the reference time generated by the oscillator.

(iii) At the stage where the time deviation data has been collected up to certain amount, for example, up to the amount of data collected for one day, the data is summed up to calculate the average value of the time deviation data. This average value is an actual deviation between the reference time and standard time (refer to FIG. 6) and therefore added to the clock time of the reference clock. This causes the time of the reference clock to be corrected to the standard time.

This method allows for employing the advantage of the reference time signal outputted by the oscillator (which has almost no deviation over a short period of time) and the advantage of the synchronization signal outputted by the GPS receiver (which brings the average of deviation over a long period of time close to the standard time), thus allowing the reference time to be stable both for a short period of time and a long period of time and to have less deviation from the standard time. Therefore, this eliminates a shift in synchronization with the reference time of each substation, thereby allowing a difference in SD time to be detected correctly and thus allowing the accuracy of fault point location to be improved.

(3) Processing in the Fault Point Location System

The procedures for identifying a fault point in the case of an occurrence of a fault on a TD line will be described below. First, location of the SD time at a substation will be explained in 3.a. Subsequently, location of a fault point at the master station will be described in 3.b.

(a) Location of SD Time at a Substation

Shown below are the location procedures of SD time at the central processing unit 141 of a substation 1.

A substation allows the ZCT 131 to receive a surge current occurring at the time of a fault, detect the surge current by means of the filter circuit 132 and the surge signal detection circuit 133, and then output the surge detection signal to the SD time holding circuit 134. Then, the SD time holding circuit 134 holds the reference time of the reception of the surge detection signal to output the reference time as the SD time to the central processing unit 141. Subsequently, the central processing unit 141 automatically sends the detection time data of the surge detection signal as fault information to the master station together with a substation number.

(b) Locating Fault Points at the Master Station,

The principle and procedures for locating fault points at the central processing unit 23 of the master station 2 will be shown below. First, the principle for locating a fault point will be explained in (I), then the procedures thereof will be explained in (II), and finally display of a fault point will be explained in (III).

(I) Principle for Locating a Fault Point

Figure 4:
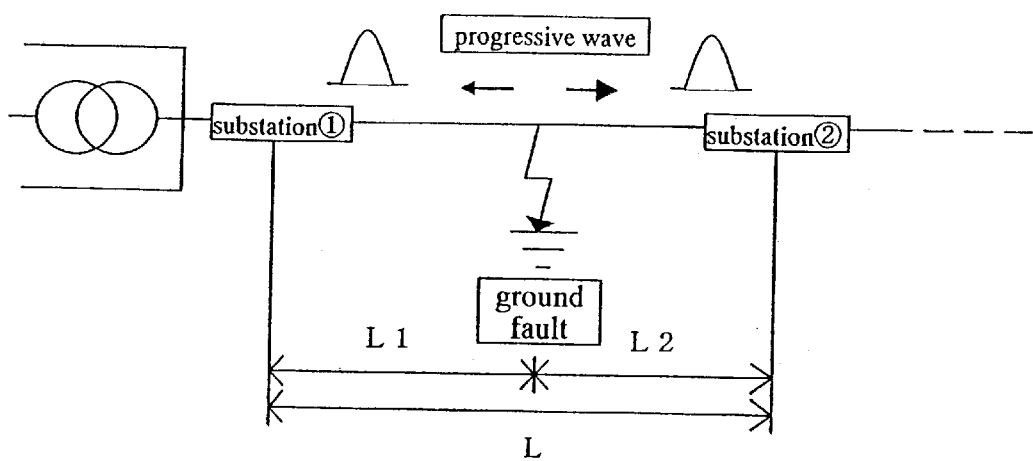
FIG. 4 is an explanatory view showing the principle for identifying a fault point described in Embodiment 1 and 2.

The principle of locating a fault point is diagrammatically shown in FIG. 4.

Occurrence of a ground fault within the section between substations ① and ②0 causes a progressive wave (a surge) to develop as shown in FIG. 4. The duration of time required for detecting this progressive wave at substations ① and ② is proportional to distance L1 and L2 from the point of occurrence of the fault to each substation assuming that the propagation velocity v of the progressive wave traveling along the TD line is constant.

That is, if the distance L between substations ① and ② is known and a difference in the duration of time detected at substations ① and ② is accurately detected, the equation "L1=(L+(t1−t2)×v)/2", shown in FIG. 4, allows for determining the distance L1 from the substation ① to the fault point.

In the fault point location system of the present embodiment, distance L on the TD line between substations (substations at the source-side end and the distal end) for which a difference in surge time is to be discussed is stored in advance. The distance L is determined by manual input or by automatic measurement such as by means of the GPS.

Furthermore, for neighboring substations, the distance on the TD line between the substations can be calculated on the basis of the position information of the substations (latitude, longitude, and altitude) assuming that the TD line is practically straight.

Still furthermore, for substations not neighboring each other, distance L on the TD line between the substations can be obtained by adding the lengths between neighboring substations which exist on the TD line between the substations.

(II) Procedures for Locating a Fault Point

The central processing unit 23 of the master station 2 stores in advance distances L on the TD line between a substation nearest to the source-side end and a substation at each distal end of the TD line.

The central processing unit 23 selects a combination of a substation 1 nearest to the source-side end on the TD line, and a substation 1 nearest to the distal end of the trunk line and spur line to locate a fault point on the basis of the difference in SD time at both substations.

That is, the central processing unit 23 determines distance L1 from the substation at the source-side end to the position of an occurrence of a fault (fault point) on the TD line by equation L1=(L+(t1−t2)×v)/2 in accordance with SD time t1 detected by the substation 1 at the source-end side, said SD time t2 detected by the substation 1 at the distal-end side, surge propagation velocity v, and length L of the TD line between the substations.

Where v is 150 to 300 m/µs in consideration of overhead line and cable distribution line cases. The v is preferably set to 250 to 300 m/µs.

Additionally, if there are substations 1 and 1 in the vicinity of the located fault point and across the fault point, the fault point can be located again on the basis of the difference in SD times of the substations for improved reliability in location.

These procedures for locating fault points may be performed in a manner such that the operator gives commands manually to the central processing unit 23, as necessary, for processing fault point location, or may be programmed in a manner such that the central processing unit 23 automatically performs the processing.

In this case, although the time of the substations at both ends must be accurately synchronized for detection of a difference in time, the reference time at each substation is corrected with an average value obtained from the reference time at which the synchronization signal accumulated over a certain period of time is received and the standard time, and synchronized by timing the reference clock of each substation with the standard time sent by the GPS satellite as mentioned above.

(III) Displaying the Location of a Fault

The central processing unit 23 of the master station 2 completes locating a fault point and then, to let the operator know the fault point, displays TD line map information stored in the auxiliary storage unit 222, and located fault points on the screen of the CRT 241. Moreover, the central processing unit 23 allows the printer 242 to perform printing in response to the operator's request.

(4) Running the Fault Point Location System

Substations 1 are installed on poles (steel towers) that support the TD line, and run continuously for 24 hours a day so as to detect faults at any time.

The master station 2 may be installed, for example, in a branch office or service office of a power company to run only during the time of presence of the operator, or may be run for 24 hours a day so as to confirm fault points at any time of an occurrence of a fault.

(5) Effects of the Fault Point Location System

The fault point location system of the present embodiment allows for identifying the position of a fault point (distance from a substation to the position of a fault point) on a difference in surge signal arrival time at substations located at both ends of the fault point (at the source end and the distal end) by keeping time synchronized and thus accurate at each station in combination of the clocking means 12 and the GPS receiving means 11 of the substation. Furthermore, even in the case where GPS radio waves cannot be received over a short period of time, the system allows for using the reference time of the substation, thereby allowing quick and accurate location of fault points.

Embodiment 2

(1) Configuration of the Fault Point Location System

As shown in FIG. 1, the fault point location system of a second embodiment of the present invention comprises;

substations 1 which are installed at each steel tower or pole along TD lines and a master station 2 which are installed at a service office or branch office of a power company, locate fault points on the basis of information from substations 1.

(a) Substations

Figure 10:
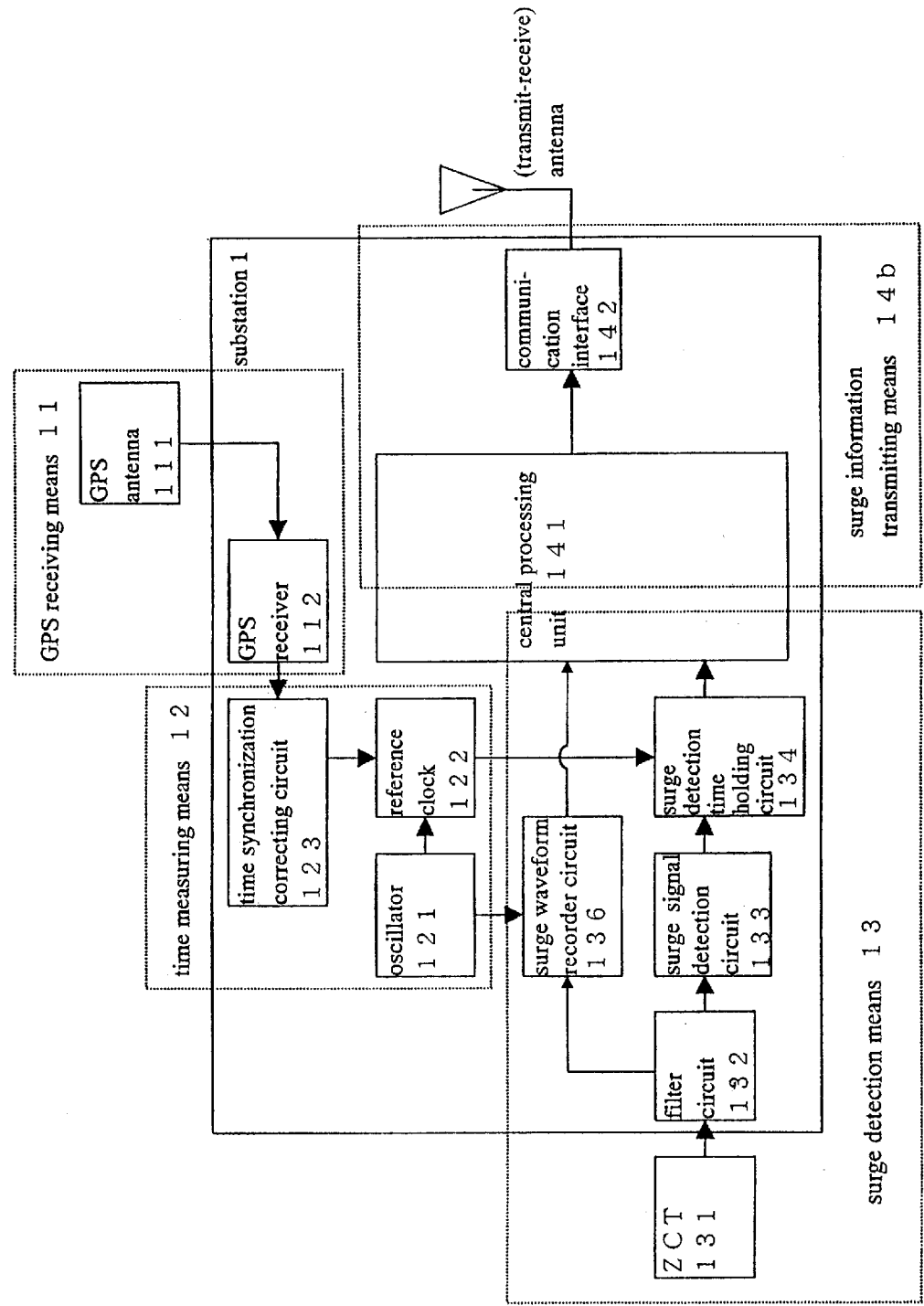
FIG. 10 is an explanatory view showing each component of substations described in Embodiment 2.

As shown in FIG. 10, a substation 1 comprises a GPS antenna 111, a GPS receiver 112, an oscillator 121, a reference clock 122, a time synchronization correcting circuit 123, a ZCT 131 (zero-phase current transformer), a filter circuit 132, a surge signal detection circuit 133, a SD time holding circuit 134, a surge waveform recorder circuit 136, a central processing unit 141, and a communication interface 142.

The ZCT 131, the filter circuit 132, the surge signal detection circuit 133, the SD time holding circuit 134, and the surge waveform recorder circuit 136 correspond to the "surge detection means 13" designated in the summary and claims of the invention. Likewise, the central processing unit 141 and the communication interface 142 correspond to the "surge information transmitting means 14b". Similarly, the GPS antenna 111 and the GPS receiver 112 correspond to the "GPS receiving means 11". Still furthermore, the oscillator 121, the reference clock 122, and the time synchronization correcting circuit 123 correspond to the "clocking means 12".

Each component of a substation will be explained below.

i) ZCT 131 (Zero-phase Current Transformer)

The ZCT 131 is mounted on a steel tower of a TD line to detect surge signals (surge current) that occur at the time of an occurrence of a fault and then send the signal to the filter circuit 132. To detect surge voltage as a surge signal, a voltage detector such as a PT or PD is used.

ii) Filter Circuit 132

The filter circuit 132 filters signals, which the ZCT 131 has detected, to remove unnecessary commercial frequency components except for a surge signal and allows only the surge signal to pass to the surge signal detection circuit 133 and the surge waveform recorder circuit 136.

iii) Surge Signal Detection Circuit 133

When the surge signal detection circuit 133 detects the level of a surge signal and the surge signal exceeds a surge recognition level, the surge signal detection circuit 133 go determines that a surge has occurred and then outputs the time holding signal to the SD time holding circuit 134. Additionally at the same time, the surge signal detection circuit 133 outputs a surge waveform recording stop signal to the surge waveform recorder circuit 136.

iv), Surge Detection Time Holding Circuit 134

When a time holding signal is outputted from the surge signal detection circuit 133, the SD time holding circuit 134 holds the time of the reference clock 122 at that time to output the time as the initial value of SD time to the central processing unit 141.

v) Surge Waveform Recorder Circuit 136

The surge waveform recorder circuit 136 converts the surge signal waveform received from the filter circuit 132 to digital data by means of an A/D converter with reference to the sampling signal received from the oscillator 121, and stores and updates the data at all times in a waveform recording memory (such as a ring memory) with a endless configuration. The surge waveform recorder circuit 136 causes the waveform recording to stop at the time a surge waveform recording stop signal is received from the surge signal detection circuit 133, and then holds the surge signal waveform that has been recorded up to that point in time on the waveform recording memory to output the waveform to the central processing unit 141.

vi) GPS Antenna 111 and GPS Receiver 112

The GPS antenna 111 receives radio waves from a GPS satellite to send the radio waves to the GPS receiver 112. Then, the GPS receiver 112 extracts, as a synchronization signal, the information on the standard time of the GPS satellite from the radio wave and then sends the signal to the time synchronization correcting circuit 123.

vii) Time Synchronization Correcting Circuit 123

In accordance with the synchronization signal outputted by the GPS receiver 112, the time synchronization correcting circuit 123 synchronizes the time of the reference clock 122 with the standard time of the GPS satellite.

viii) Reference Clock 122

The reference clock 122 outputs the reference time to the SD time holding circuit 134.

ix) Oscillator 121

The oscillator 121 outputs the reference time signal for clocking time to the reference clock 122. In addition, the oscillator 121 outputs the waveform sampling signal in synchronization with the reference time signal to the surge waveform recorder circuit 136.

x) Central Processing Unit 141

In accordance with the initial value of the SD time outputted by the SD time holding circuit 134 and the surge signal waveform outputted by the surge waveform recorder circuit 136, the central processing unit 141 identifies the time at which voltage has exceeded the surge waveform starting level immediately before the initial value of the SD, time and then sends the time as the SD time to the master station 2 via the communication interface 142.

xi) Communication Interface 142

To enable the central processing unit 141 to communicate with the master station 2 using the public communication network, the communication interface 142 passes communication signals between the central processing unit 141 and the public communication network.

A substation 1 comprises the abovementioned components, thereby enabling to identify its own position on the basis of the GPS wave and to transmit the information to the master station.

b) Master Station

As shown in FIG. 3, a master station 2 comprises a communication interface 21, an auxiliary storage unit 222, a central processing unit 23, a CRT 241, a printer 242, and a keyboard 25. These components of the master station 2 have the same configuration as those of embodiment 1.

The communication interface 21 receives position information from each substation and corresponds to the "substation location information receiving means 21a" designated in the summary and claims of the invention. Furthermore, the communication interface 21 receives information on the SD time from each substation and similarly corresponds to the "substation surge information receiving means 21b". The central processing unit 23 prepares TD line map information on the basis of the position information of substations and similarly corresponds to the "TD line map information preparing means 23a", and locates a fault point on the basis of the SD time and likewise corresponds to the "fault location identifying means 23c". The auxiliary storage unit 222 corresponds to the "map information storage means". Likewise, the CRT 241 and the printer 242 outputs the results of location and correspond to the "TD line map information output means". Likewise, the keyboard 25 corresponds to the "input means".

(2) Processing in the Fault Point Location System

The procedures for identifying a fault point in the case of an occurrence of a fault on a TD line will be described below. First, location of the SD time at a substation will be explained in (a). Subsequently, location of a fault point at the master station will be described in (b).

(a) Location of SD Time at a Substation

To reduce a difference in SD time resulting from a difference in the rising time of a surge signal, the central processing unit 141 corrects the initial value of the SD time determined as the time at which the surge signal exceeds a surge recognition level to obtain the SD time.

Figure 11:
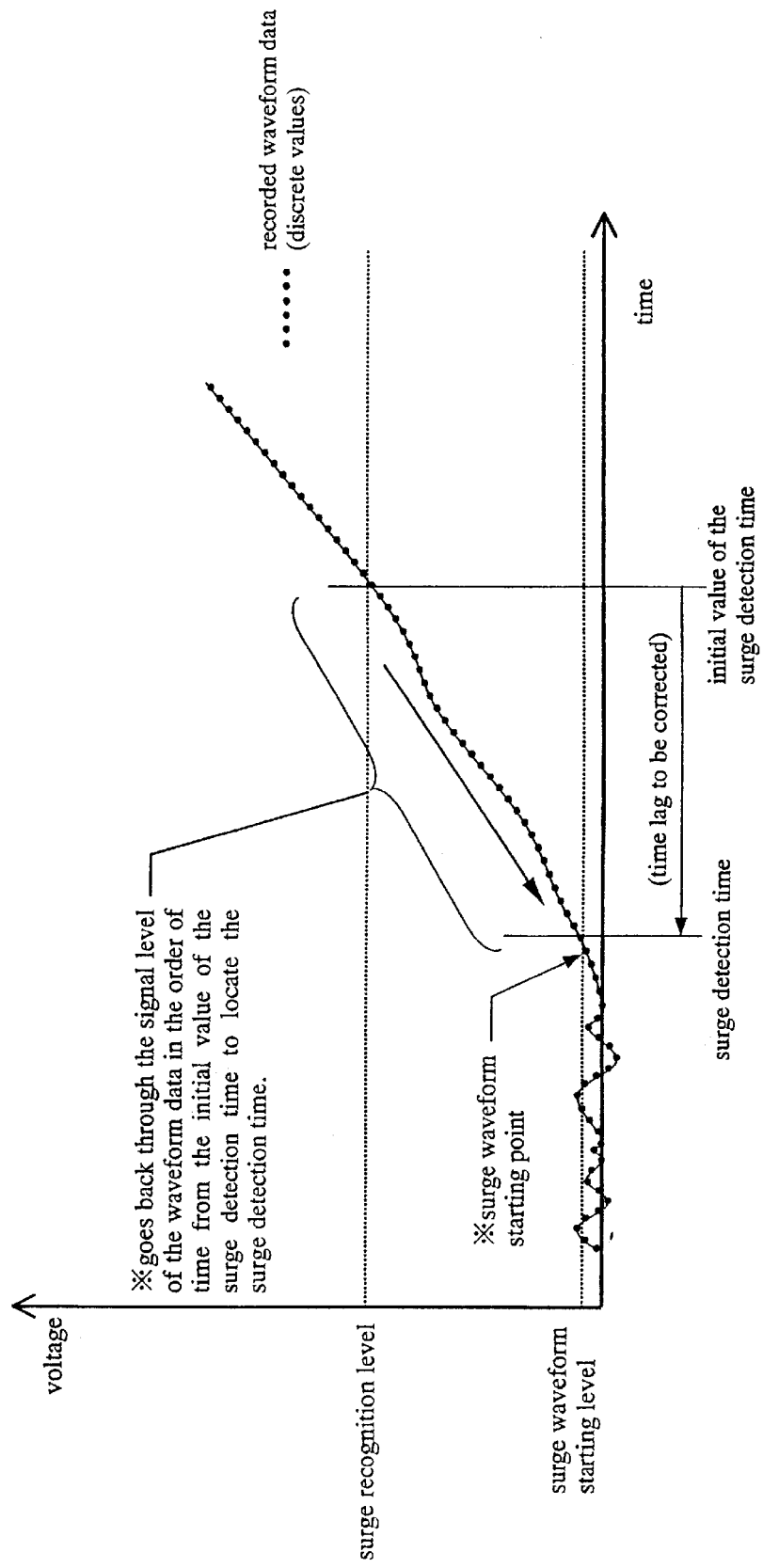
FIG. 11 is an explanatory view showing the location method of SD time at a substation described in Embodiment 2.
Figure 12:
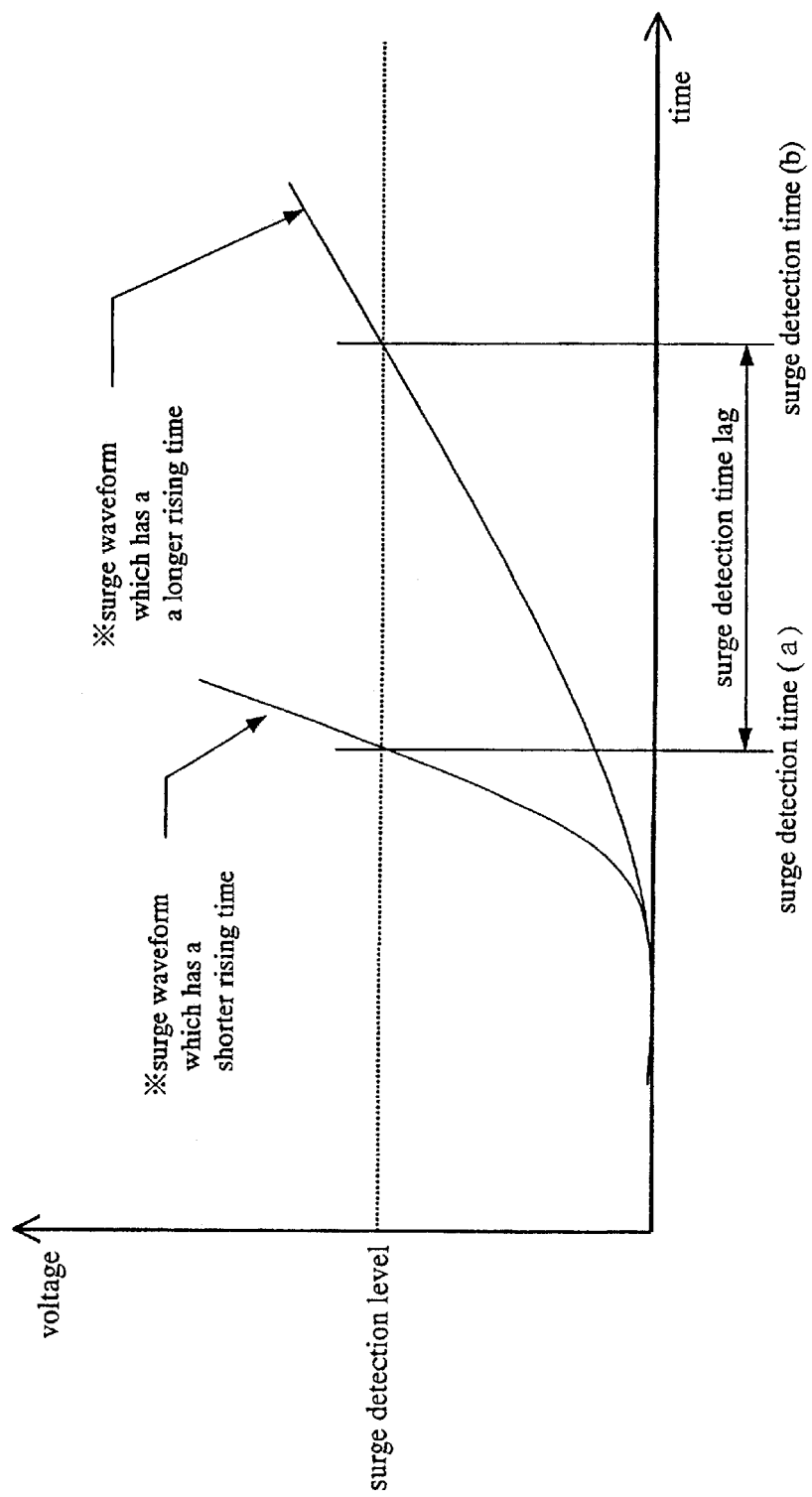
FIG. 12 is an explanatory view showing surge detection time lag due to difference of surge waveform.
Figure 13:
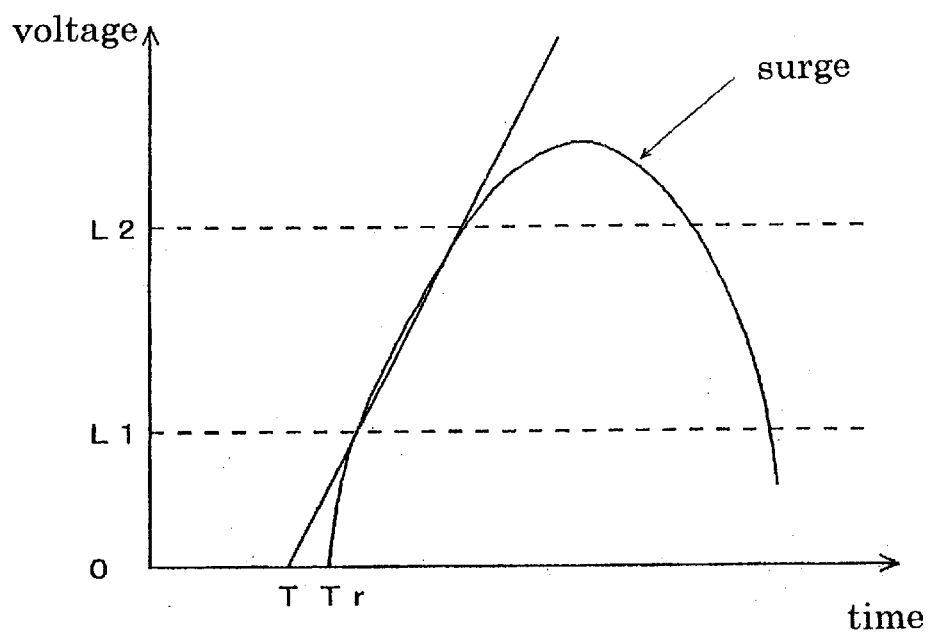
FIG. 13 is an explanatory view showing the double potential method.
Figure 14:
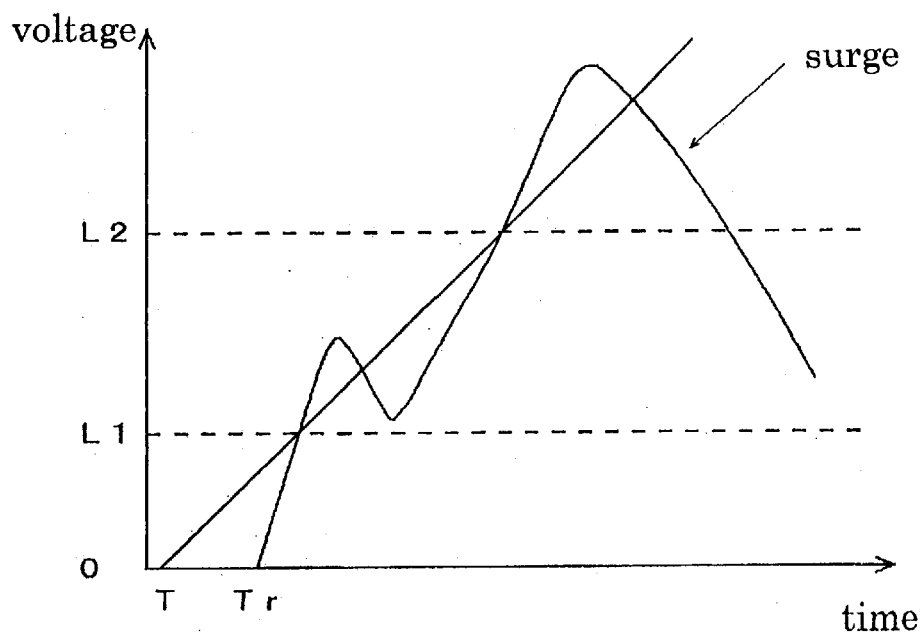
FIG. 14 is an explanatory view showing the double potential method when a preceding surge exists.

The procedures for determining the SD time in the central processing unit 141 of a station 1 will be shown below. (Procedure 1) The central processing unit 141 receives the initial value of the SD time from the SD time holding circuit 134 and receives surge waveform data in the form of discrete value from the surge waveform recorder circuit 136 (Refer to FIG. 10 and FIG. 11). (Procedure 2) The central processing unit 141 goes back through the waveform data (discrete values) from the initial value of the SD time sequentially in the order of time to compare levels of waveform data until the signal level goes equal to or less than the surge waveform starting level (Refer to FIG. 11). (Procedure 3) When the signal level of the waveform data reaches the surge waveform starting level, the central processing unit 141 deduces the sampling interval multiplied by ("the number of times of going-back repetitions to reach the signal" −1) from the initial value of the SD time to determine the time to be the SD time (Refer to FIG. 11).

(b) Locating Fault Points at the Master Station

The principle and procedures for locating fault points at the central processing unit 23 of the master station 2 will be shown below. First, the principle for locating a fault point will be explained in (I), then the procedures thereof will be explained in (II), and finally display of a fault position will be explained in (III).

(I) Principle for Locating a Fault Point

The principle of locating a fault point is diagrammatically shown in FIG. 4.

Occurrence of a ground fault within the section between substations ① and ② causes a progressive wave (a surge) to develop as shown in FIG. 4. The duration of time required for detecting this progressive wave at substations ① and ② is proportional to distance L1 and L2 from the point of occurrence of the fault to each substation assuming that the propagation velocity v of the progressive wave traveling along the TD line is constant.

That is, if the distance L between substations ① and ② is known and a difference in the duration of time detected at substations ① and ② is accurately detected, the equation "L1=(L+(t1−t2)×v)/2", shown in FIG. 4, allows for determining the distance L1 from the substation ① to the fault point.

In the fault point location system of the present embodiment, distance L on the TD line between substations (substations at the source-side end and the distal end) for which a difference in surge time is to be discussed is stored in advance.

Furthermore, for neighboring substations, the distance on the TD line between the substations can be calculated on the basis of the position information of the substations (latitude, longitude, and altitude) assuming that the TD line is practically straight.

Still furthermore, for substations not neighboring each other, distance L on the TD line between the substations can be obtained by adding the lengths between neighboring substations which exist on the TD line between the substations.

(II) Procedures for Locating a Fault Point

The central processing unit 23 of the master station 2 stores in advance distances L on the TD line between a substation nearest to the source-side end and a substation at each distal end of the TD line.

The central processing unit 23 selects a combination of a substation 1 nearest to the source-side end on the TD line, and a substation 1 nearest to the distal end of the trunk line and a spur line to locate a fault point on the basis of the difference in SD time at both substations.

That is, the central processing unit 23 determines distance L1 from the substation at the source-side end to the position of an occurrence of a fault (fault point) on the TD line by equation L1=(L+(t1−t2)×v)/2 in accordance with SD time t1 detected by the substation 1 at the source-end side, said SD time t2 detected by the substation 1 at the distal-end side, surge propagation velocity v, and length L of the TD line between the substations.

Where v is 150 to 300 m/µs in consideration of overhead line and cable distribution line cases. The v is preferably set to 250 to 300 m/µs.

Additionally, if there are substations 1 and 1 in the vicinity of the located fault point and across the fault point, the fault point can be located again on the basis of the difference in SD times of the substations for improved reliability in location.

These procedures for locating fault points may be performed in a manner such that the operator gives commands manually to the central processing unit 23, as necessary, for processing fault point location, or may be programmed in a manner such that the central processing unit 23 automatically performs the processing.

In this case, although the time of the substations at both ends must be accurately synchronized for detection of a difference in time, the time at each substation its synchronized by timing the reference clock of each substation with the standard time sent by the GPS satellite as mentioned above.

(III) Displaying Points of an Occurrence of Fault

The central processing unit 23 of the master station 2 completes locating a fault point and then, to let the operator know the fault point, displays TD line map information stored in the auxiliary storage unit 222, and located fault points on the screen of the CRT 241. Moreover, the central processing unit 23 allows the printer 242 to perform printing in response to the operator's request.

(3) Running the Fault Point Location System

Substations 1 are installed on poles (steel towers) that support the TD line, and run continuously for 24 hours a day so as to detect faults at any time.

The master station 2 may be installed, for example, in a branch office or service office of a power company to run only during the time of presence of the operator, or may be run for 24 hours a day so as to confirm fault points at any time of an occurrence of fault.

(4) Effects of the Fault Point Location System

The fault point location system of the present embodiment identifies the position of a fault point (the distance from a substation to the fault point) on the basis of a, difference in a surge signal arrival time detected at substations situated at both sides across the fault point (at the source end and the distal end.) Therefore, location of fault points can be performed quickly and accurately.

Other

It is to be understood that the present invention includes, but is not limited to, said individual embodiment and may be modified or varied according to objects and applications within the scope of the present invention.

That is, an average value may be determined for the time error data, a difference between the reference time and the standard time obtained from the GPS each of which is either collected for one day or accumulated in advance to be stored and then divided by the times of collections.

Furthermore, information from a substation to the master station may be transmitted either by using wired or wireless public networks such as a portable telephone, PHS, and a public telephone network, or by leased line networks provided on TD lines (such as metal cable, optical fiber, and wireless). Moreover, signals may be modified by carriers and then transmitted on TD lines.

Still furthermore, map data in the TD line map information includes, but is not limited to, those stored either in an auxiliary storage, or in other recording media such as a magnetic disk unit, an optical disk (such as CD-ROM and DVD), and an optical magnetic disk unit. Alternatively, map data may be downloaded or searched on-line from a server in a WWW site that provides map information systems on the Internet. Such an embodiment as allows map data to be downloaded or searched on-line from a server via the Internet eliminates the need to store individual map information and always allows the latest map information to be made available.

What is claimed is:

1. A fault point location system comprising substations (1) which are installed along a transmission and distribution line to transmit information on surge detection time to a master station (2), and the master station (2) which locates fault points on the basis of the information on said surge detection time, wherein said substation (1) determines a difference between a standard time of a GPS which is obtained from a received GPS radio wave, and a reference time of said substation (1) at which said standard time has been obtained, accumulates said difference over a certain period of time, corrects the reference time by adding an average value of said difference stored to said reference time, determines a detection time of a surge voltage or surge current produced by a fault having occurred at a certain point on the transmission and distribution line in accordance with said reference time, and then transmits the detection time to said master station (2) via a communication network.

2. A fault point location system according to claim 1, said master station (2) determines, as shown in the fault location system of a second invention, in accordance with said surge detection time t1 detected at one of a pair of substations across a fault point on said transmission and distribution line network, said surge detection time t2 detected at the other substation, surge propagation velocity v, and length L of the transmission and distribution line between said substations, distance L1 on the transmission and distribution line from one of the substations to said fault point by equation L1=(L+(t1−t2)×v)/2.

3. A fault point location system according to claim 1, said master station (2) determines, as shown in the fault point location system of a third invention, in accordance with said surge detection time t1 detected by a substation nearest to the source-side end along said transmission and distribution line network, said surge detection time t2 detected by another substation at the distal end of the transmission and distribution line network, surge propagation velocity v, and length L of the transmission and distribution line between said substations, distance L1 on the transmission and distribution line from the substation at said source-side end to said fault point by equation L1=L+(t1−t2)×v)/2; and furthermore, determines, in accordance with said surge detection time t3 detected at one of a pair of substations across the fault point determined by the aforementioned calculation, said surge detection time t4 detected at the other substation, surge propagation velocity v, and length L' of the transmission and distribution line between said pair of substations, distance L3 on the transmission and distribution line from said one of the substations to said fault point by equation L3=(L'+(t3−t4)×v)/2.

4. A fault point location system comprising a substation (1) which is installed on a transmission and distribution line to transmit information on surge detection time to a master station (2), and the master station (2) which locates fault points on the basis of the information on said surge detection time, characterized in that:

said substation (1) stores and updates past voltage or current waveforms of said transmission and distribution line ranging at least from a current time to a preceding time for a certain period of time, stores a surge recognition level which is a reference level for recognizing surges and sets the surge recognition level to a level higher than a noise level, stores a surge waveform starting level which is a reference level for determining a starting point of surge waveforms and sets the surge waveform starting level to a level lower than said surge recognition level, determines as a surge detection time, in the case where the voltage or current of said transmission and distribution line exceeds said surge recognition level, the time at which said voltage or current exceeded said surge waveform starting level for a first time after going back through said waveforms stored from the time at which said surge recognition level was exceeded, and sends said surge detection time to said master station (2) via the communication network.

5. A fault point location system according to claim 4 wherein;

said master station (2) determines, in accordance with said surge detection time t1 detected at one of a pair of substations across a fault point on said transmission and distribution line network, said surge detection time t2 detected at the other substation, surge propagation velocity v, and length L of the transmission and distribution line between said substations, distance L1 on the transmission and distribution line from one of the substations to said fault point by equation L1=(L+(t1−t2)×v)/2.

6. A fault point location system according to claim 4 wherein;

said master station (2) determines, in accordance with said surge detection time t1 detected by a substation nearest to the source-side end on said transmission and distribution line network, said surge detection time t2 detected by another substation At the distal end of the transmission and distribution line, surge propagation velocity v, and length L of the transmission and distribution line between said substations, distance L1 on the transmission and distribution line from the substation at said source-side end to said fault point by equation L1=(L+(t1−t2)×v)/2; and furthermore, determines, in accordance with said surge detection time t3 detected at one of a pair of substations across the fault point determined by the aforementioned calculation, said surge detection time t4 detected at the other substation, surge propagation velocity v, and length L' of the transmission and distribution line between said pair of substations, distance L3 on the transmission and distribution line from said one of the substations to said fault point by equation L3=(L'+(t3−t4)×v)/2.

7. A fault point location system according to claim 4 wherein;

said past voltage or current waveforms are stored in a form of discrete values to be sampled at intervals of constant time, allowing for determining, as said surge detection time, the sampling time next to the sampling time at which, going back from the time at which said surge recognition level was exceeded, a sample value fell short of said surge waveform starting level for the first time.

* * * * *